(12) United States Patent
Yamamoto

(10) Patent No.: US 10,420,212 B2
(45) Date of Patent: Sep. 17, 2019

(54) WIRING BOARD, ELECTRONIC APPARATUS, AND METHOD FOR MANUFACTURING ELECTRONIC APPARATUS

(71) Applicant: FUJITSU LIMITED, Kawasaki-shi, Kanagawa (JP)

(72) Inventor: Keiichi Yamamoto, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/029,936

(22) Filed: Jul. 9, 2018

(65) Prior Publication Data

US 2019/0021167 A1    Jan. 17, 2019

(30) Foreign Application Priority Data

Jul. 14, 2017  (JP) .................................. 2017-138395

(51) Int. Cl.

| | | |
|---|---|---|
| H05K 1/11 | (2006.01) | |
| H05K 3/40 | (2006.01) | |
| H05K 3/34 | (2006.01) | |
| H01L 23/498 | (2006.01) | |
| H01L 23/00 | (2006.01) | |
| H01L 21/48 | (2006.01) | |

(Continued)

(52) U.S. Cl.
CPC .......... *H05K 1/111* (2013.01); *H01L 21/4853* (2013.01); *H01L 23/49811* (2013.01); *H01L 24/16* (2013.01); *H01L 24/81* (2013.01); *H05K 1/0271* (2013.01); *H05K 1/119* (2013.01); *H05K 1/181* (2013.01); *H05K 3/3494* (2013.01); *H05K 3/4007* (2013.01); *H01L 2224/0401* (2013.01); *H01L 2224/16227* (2013.01); *H01L 2224/16237* (2013.01); *H01L 2224/81815* (2013.01); *H01L 2924/3511* (2013.01); *H01L 2924/3841* (2013.01); *H05K 3/3436* (2013.01); *H05K 2201/09136* (2013.01); *H05K 2201/09418* (2013.01); *H05K 2201/09845* (2013.01); *H05K 2201/09909* (2013.01); *H05K 2201/10734* (2013.01)

(58) Field of Classification Search
CPC .......... H05K 1/111; H05K 2201/0989; H05K 2201/09845; H05K 2201/099; H05K 2201/09818
See application file for complete search history.

(56) References Cited

U.S. PATENT DOCUMENTS

| | | | | |
|---|---|---|---|---|
| 4,528,259 A | * | 7/1985 | Sullivan | .................... G03F 7/00 205/120 |
| 6,031,293 A | * | 2/2000 | Hsuan | .................... H01L 24/05 257/698 |

(Continued)

FOREIGN PATENT DOCUMENTS

| | | |
|---|---|---|
| JP | 11-251472 | 9/1999 |
| JP | 2004-214357 | 7/2004 |

*Primary Examiner* — Steven T Sawyer
(74) *Attorney, Agent, or Firm* — Fujitsu Patent Center

(57) ABSTRACT

A wiring board includes a substrate, an electrode on a surface of the substrate, a wall surface in a ring shape surrounding an outer circumference of the electrode, an upper end of the wall surface is located at a position higher than a surface of the electrode, and a protrusion at the upper end of the wall surface, the protrusion protruding with respect to the wall surface inward of a ring shape defined by the wall surface.

15 Claims, 17 Drawing Sheets

(51) Int. Cl.
 *H05K 1/02* (2006.01)
 *H05K 1/18* (2006.01)

(56) References Cited

U.S. PATENT DOCUMENTS

| | | | | |
|---|---|---|---|---|
| 2003/0020145 | A1* | 1/2003 | Umezaki | H01L 23/49816 257/657 |
| 2004/0200065 | A1* | 10/2004 | Tsukahara | H05K 3/321 29/832 |
| 2008/0061437 | A1* | 3/2008 | Kohara | H01L 23/13 257/738 |
| 2011/0048782 | A1* | 3/2011 | Hsu | H05K 1/111 174/261 |
| 2011/0088929 | A1* | 4/2011 | Yang | H05K 3/4007 174/254 |
| 2014/0027160 | A1* | 1/2014 | Hong | H05K 1/111 174/257 |
| 2014/0054075 | A1* | 2/2014 | Hu | H05K 3/3452 174/257 |

\* cited by examiner

WIRING BOARD, ELECTRONIC APPARATUS, AND METHOD FOR MANUFACTURING ELECTRONIC APPARATUS

CROSS-REFERENCE TO RELATED APPLICATION

This application is based upon and claims the benefit of priority of the prior Japanese Patent Application No. 2017-138395, filed on Jul. 14, 2017, the entire contents of which are incorporated herein by reference.

FIELD

The embodiments discussed herein are related to a wiring board, an electronic apparatus, a method for manufacturing the wiring board, and a method for manufacturing the electronic apparatus.

BACKGROUND

There are known the following techniques related to a structure around the electrodes of a wiring board. One known example is a technique for inversely tapering the resist layer in cross section by forming a photosensitive resist layer on the main surface of an interposer substrate on which an electrode pad is formed and shifting the focus of an exposing process in removing unnecessary resist on the electrode.

Another known example is a technique for forming electrodes in the surface of the circuit board.

An electronic component having a ball grid array (BGA) structure is joined to a wiring board through reflow processing on ball-like terminals such as solder balls. However, this can cause the wiring board to suffer warping due to the heat at the reflow processing, resulting in a joining defect. For example, the warping of the wiring board may excessively increase the distance between the terminals of the electronic component and the electrodes of the wiring board, causing a joining failure. The warping of the wiring board can excessively can increase the distance between the terminals of the electronic component and the electrodes of the wiring board to crush the solder and spread the solder to form a solder bridge between the electrodes, causing a short circuit.

Another problem is that when the condition of the warp of the wiring board is changed by returning the temperature of the wiring board to which the electronic component is bonded after the reflow processing, the junction is continuously stressed, and the reliability of bonding is reduced.

An example of a method for reducing the above problems is to use solder having a relatively low melting point, such as bismuth (Bi)-based solder. However in this case, the reflow temperature is about 200° C., so that no great effect is given.

Instead of solder, a cold-setting electrically conductive adhesive can be used. The electrically conductive adhesive is an adhesive in which electrically conductive particles are dispersed in a thermosetting resin, such as an epoxy resin. A known example is silver (Ag) paste that contains Ag as the conductive particles. In recent years, an electrically conductive adhesive capable of bonding at about 80° C., which is sufficiently lower than the glass transfer temperature Tg of the wiring board, has been developed. The use of such an electrically conductive adhesive reduces the warping of the wiring board.

However, the bonding strength at the junction using the electrically conductive adhesive is lower than the bonding strength using solder, which makes it difficult to ensure the bonding reliability. In particular, it is not easy to check the appearance of the junction between the electrodes of a wiring board and the terminals of an electronic component having a structure in which the terminals are disposed on the bottom, such as a BGA. For that reason, it is preferable to join the electrodes of the wiring board and the terminals of the electronic component reliably and stably.

The followings are reference documents.
[Document 1] Japanese Laid-open Patent Publication No. 11-251472, and
[Document 2] Japanese Laid-open Patent Publication No. 2004-214357.

SUMMARY

According to an aspect of the invention, a wiring board includes a substrate, an electrode on a surface of the substrate, a wall surface in a ring shape surrounding an outer circumference of the electrode, an upper end of the wall surface is located at a position higher than a surface of the electrode, and a protrusion at the upper end of the wall surface, the protrusion protruding with respect to the wall surface inward of a ring shape defined by the wall surface.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
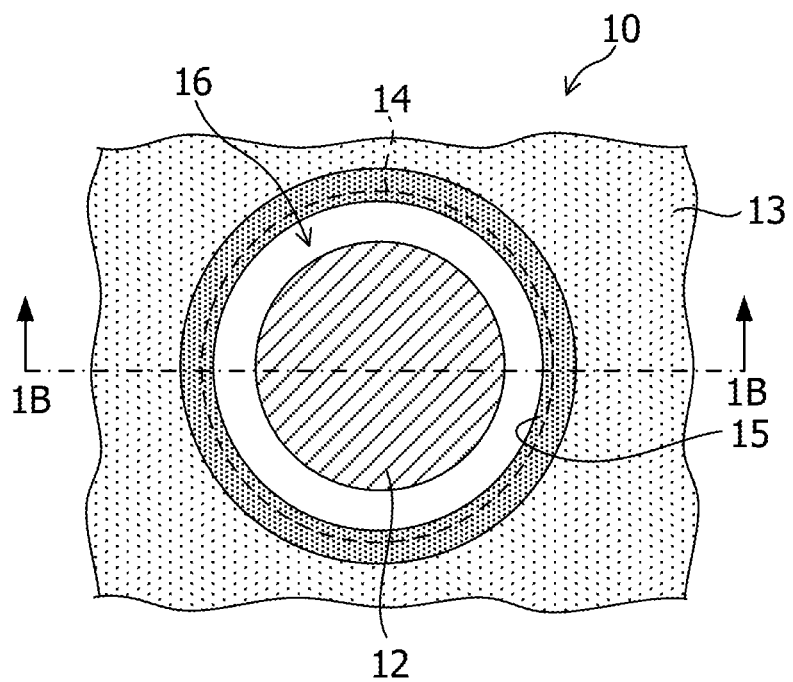
FIG. 1A is a partial plan view of a wiring board according to a first embodiment of the disclosed technique illustrating the configuration around an electrode.

Embodiments of the disclosed technique will be described hereinbelow with reference to the drawings. The same or equivalent components and parts are given the same reference signs in the drawings.

First Embodiment

Figure 1B:
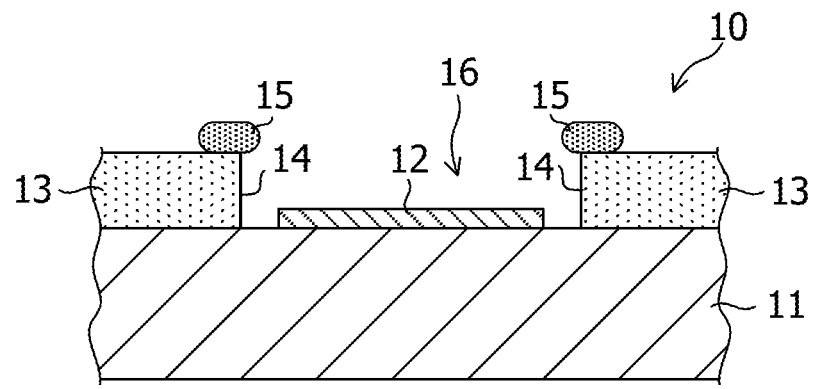
FIG. 1B is a cross-sectional view of the wiring board in FIG. 1A taken along line 1B-1B.

FIG. 1A is a partial plan view of a wiring board 10 according to a first embodiment of the disclosed technique illustrating the configuration around an electrode. FIG. 1B is a cross-sectional view taken along line 1B-1B in FIG. 1A. The wiring board 10 is a wiring board on which an electronic component 30 (see FIG. 4C), described later, is to be mounted. The wiring board 10 includes a substrate 11, an electrode 12, a solder resist 13, and a protrusion 15.

The substrate 11 is made of an insulating material, such as a glass epoxy resin. A plurality of wiring layers may be disposed in the substrate 11. The electrode 12 is made of an electrically conductive material, such copper (Cu). The electrode 12 is formed on the surface of the substrate 11. The electrode 12 is bonded to a ball-like terminal 31 provided on the electronic component 30. In the present embodiment, the electrode 12 has a circular shape corresponding to the shape of the ball-like terminal 31. This is given merely for illustrative purposes and may have any shape.

The solder resist 13 is made of an insulating material, such as a photosensitive resin, which covers the surface of the substrate 11. The solder resist 13 has a circular opening 16 through which the electrode 12 is to be exposed. The end face of the opening 16 forms a ring-shaped wall surface 14 surrounding the outer circumference of the electrode 12. The thickness of the solder resist 13 (that is, the height of the wall surface 14) is preferably larger than the thickness of a general wiring board (for example, 30 μm to 50 μm), specifically, about 100 μm to 200 μm. Thus, the heightwise position of the upper end of the wall surface 14 is higher than the heightwise position of the surface of the electrode 12.

The protrusion 15 is disposed on the surface of the solder resist 13 and along the outer rim of the opening 16. The protrusion 15 is disposed on the upper end of the wall surface 14 and protrudes with respect to the wall surface 14 inward of the ring shape defined by the wall surface 14. The material of the protrusion 15 is not particularly limited and may be resin ink for use in silk printing for printing characters, numerals, and signs on the surface of the wiring board 10. The protrusion 15 can be made of the same resin material as that of the solder resist 13.

Figure 2A:
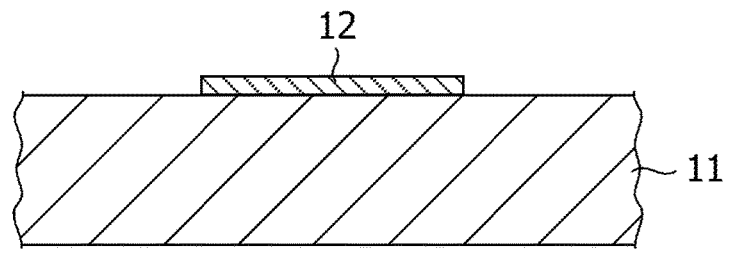
FIGS. 2A, 2B, and 2C are cross-sectional views of the wiring board according to the first embodiment of the disclosed technique illustrating a method of manufacture.
Figure 2B:
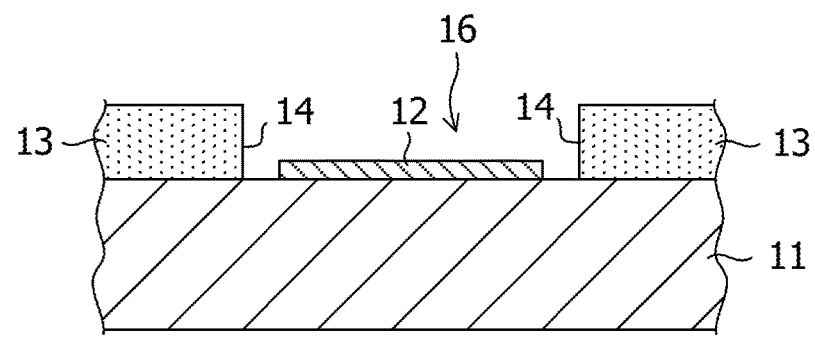
Figure 2C:
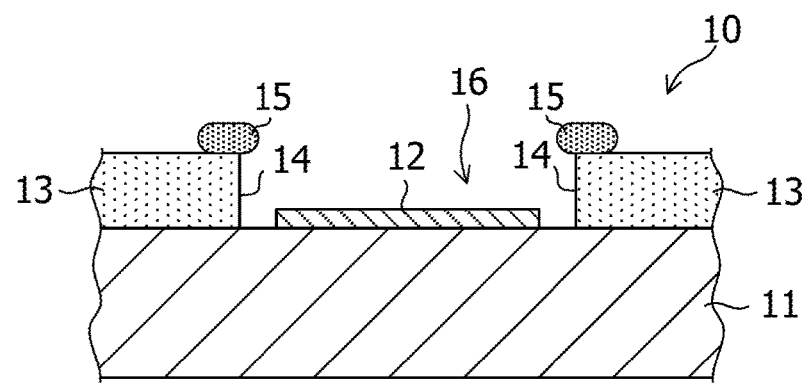

FIGS. 2A, 2B, and 2C are cross-sectional views of the wiring board 10 illustrating a method of manufacture. First, the electrode 12 is formed by patterning a conductor film formed on the surface of the substrate 11 (FIG. 2A).

Next, the solder resist 13 is formed on the entire surface of the substrate 11 by printing, splaying, or another method. Thereafter, the solder resist 13 is patterned by exposing and developing processes to form the opening 16 through the electrode 12 is to be exposed. Thus, the ring-shaped wall surface 14 surrounding the outer circumference of the electrode 12 is formed (FIG. 2B). After the opening 16 is formed, the solder resist 13 is hardened by heat treatment. The thickness of the solder resist 13 (that is, the height of the wall surface 14) is preferably about 100 μm to 200 μm. To ensure this thickness, the above processes may be repeated a plurality of times so that an upper resist layer is layered on a lower resist layer. A desired thickness may be ensured by layering dry-film type solder resists.

Figure 3A:
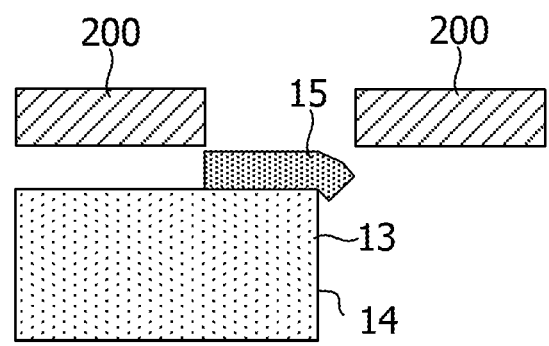
FIGS. 3A and 3B are cross-sectional views of the wiring board according to the first embodiment of the disclosed technique illustrating a method of manufacture.
Figure 3B:
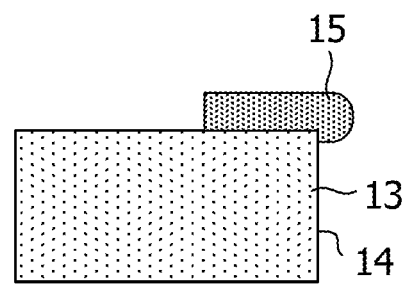

Next, resin ink or a resist material is applied to the surface of the solder resist 13 along the outer rim of the opening 16 and is then hardened. Thus, the protrusion 15 is formed along the outer rim of the opening 16 of the solder resist 13. The protrusion 15 is formed such that an end protrudes inward of the opening 16 with respect to the wall surface 14 (from the end face of the opening 16) (FIG. 2C). The resin ink or the resist material, which is applied using a mask 200, as illustrated in FIG. 3A, is hardened by heat treatment or the like, and the end of the protrusion 15 is rounded due to sagging, as illustrated in FIG. 3B. In the case where resin ink is used as the material of the protrusion 15, the resin ink may be applied by an ink jet method. The ink jet method does not use the mask 200 and allows the position where the resin ink is applied to be controlled with high accuracy.

Figure 4A:
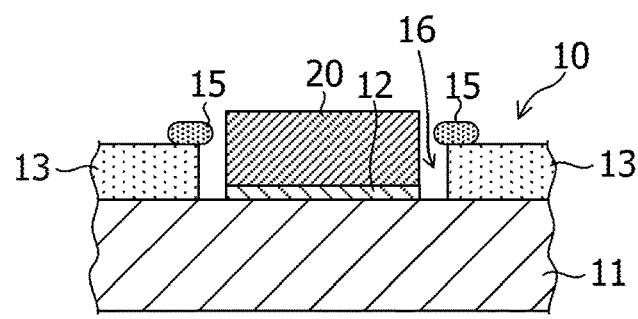
FIGS. 4A, 4B, and 4C are cross-sectional views of an electronic apparatus according to an embodiment of the disclosed technique illustrating a method of manufacture.
Figure 4B:
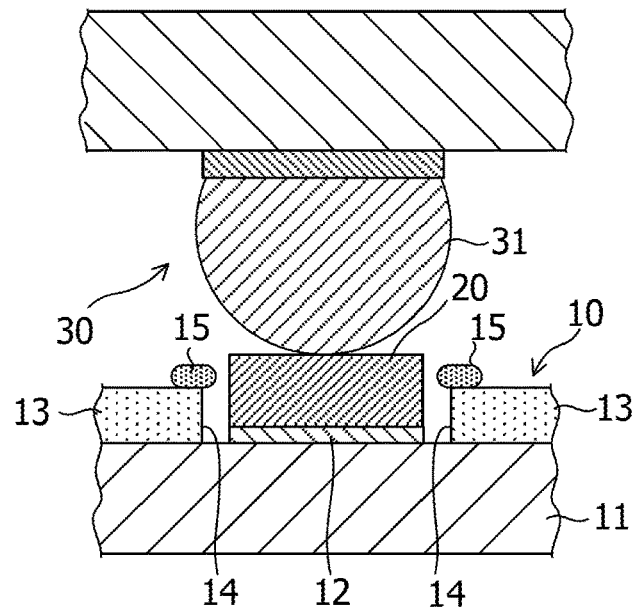
Figure 4C:
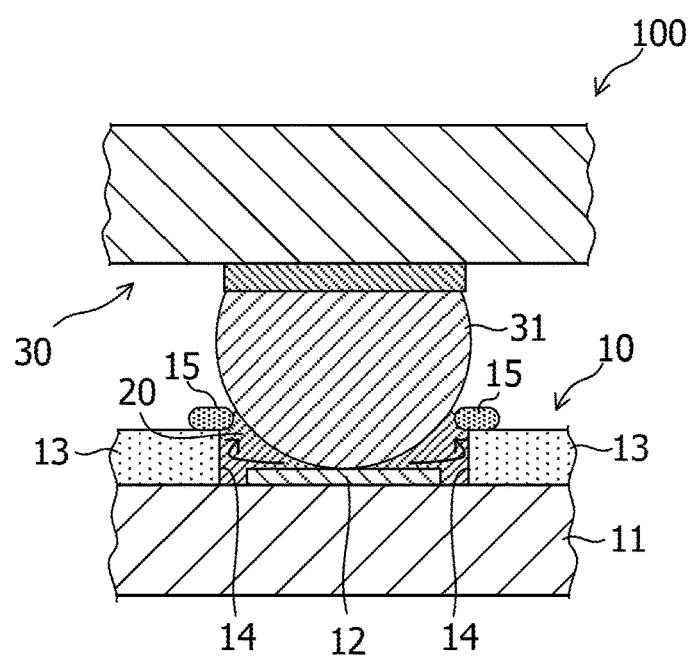

FIGS. 4A, 4B, and 4C are cross-sectional views of an electronic apparatus 100 including the wiring board 10 and the electronic component 30 mounted on the wiring board 10 according to an embodiment of the disclosed technique illustrating a method of manufacture.

An electrically conductive adhesive 20 is formed on the surface of the electrode 12 on the wiring board 10 by printing, applying, or another method (FIG. 4A). The electrically conductive adhesive 20 is a bonding material containing thermosetting resin, such as an epoxy resin, in which electrically conductive particles are dispersed. The temperature at which the electrically conductive adhesive 20 is hardened is preferably lower than the glass transfer temperature Tg of the wiring board 10 from the viewpoint of suppressing the occurrence of warping of the wiring board 10 due to heating. Examples of the material of the electrically conductive particles include gold (Au), silver (Ag), copper (Cu), nickel (Ni), and aluminum (Al). A preferable example of the material of the electrically conductive adhesive 20 is silver paste in which silver powder is dispersed in a thermosetting resin. The electrically conductive adhesive 20 preferably has the property that it is flowable and unlikely to lose its shape. Specifically, the electrically conductive adhesive 20 preferably has appropriate viscosity (for example, 20 Pa·Sec to 200 Pa·Sec) and an appropriate thixotropic ratio (for example, 4.5 to 6.0).

Next, the electronic component 30 with a BGA structure to be mounted on the wiring board 10 is prepared. The electronic component 30 may be a semiconductor device including a plurality of ball-like terminals 31 arranged in a lattice pattern on one surface. The ball-like terminals 31 may be solder balls. The electronic component 30 is picked up with a component mounter (not illustrated) and is positioned so that each ball-like terminal 31 is located directly on a corresponding electrode 12 of the wiring board 10 (FIG. 4B).

Thereafter, a pressure that presses the ball-like terminal 31 to the electrically conductive adhesive 20 is applied to the electronic component 30. This causes the electrically conductive adhesive 20 to be pressed out of the electrode 12. The pressed-out electrically conductive adhesive 20 creeps upward along the wall surface 14 of the solder resist 13. Thereafter, when the electrically conductive adhesive 20 reaches the protrusion 15, the direction in which the electrically conductive adhesive 20 flows changes toward the ball-like terminal 31. Thus, controlling the direction in which the electrically conductive adhesive 20 flows using the wall surface 14 and the protrusion 15 allows the electrically conductive adhesive 20 to reach a relatively high position of the ball-like terminal 31 (FIG. 4C). Thereafter, the electrically conductive adhesive 20 is hardened by heat treatment, so that the bonding of the ball-like terminal 31 of the electronic component 30 and the electrode 12 of the wiring board 10 is completed.

Figure 5:
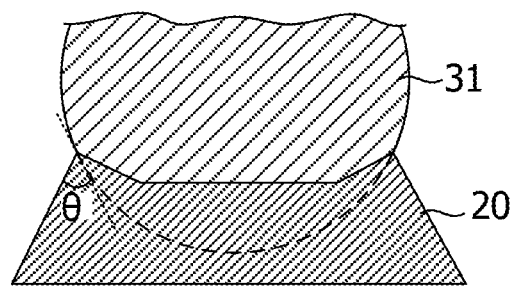
FIG. 5 is a diagram illustrating the state of contact between an electrically conductive adhesive and a ball-like terminal of an electronic apparatus according to an embodiment of the disclosed technique.

FIG. 5 is a diagram illustrating the state of contact between the electrically conductive adhesive 20 and the ball-like terminal 31 of the electronic apparatus 100 manufactured as described above. Thus, guiding the electrically conductive adhesive 20 toward the ball-like terminal 31 with the wall surface 14 and the protrusion 15 formed on the wiring board 10 allows the electrically conductive adhesive 20 to reach a relatively high position of the ball-like terminal 31. This allows the fillet angle θ of the electrically conductive adhesive 20 to be less than or equal to 90°, forming a desirable fillet shape.

Figure 6:
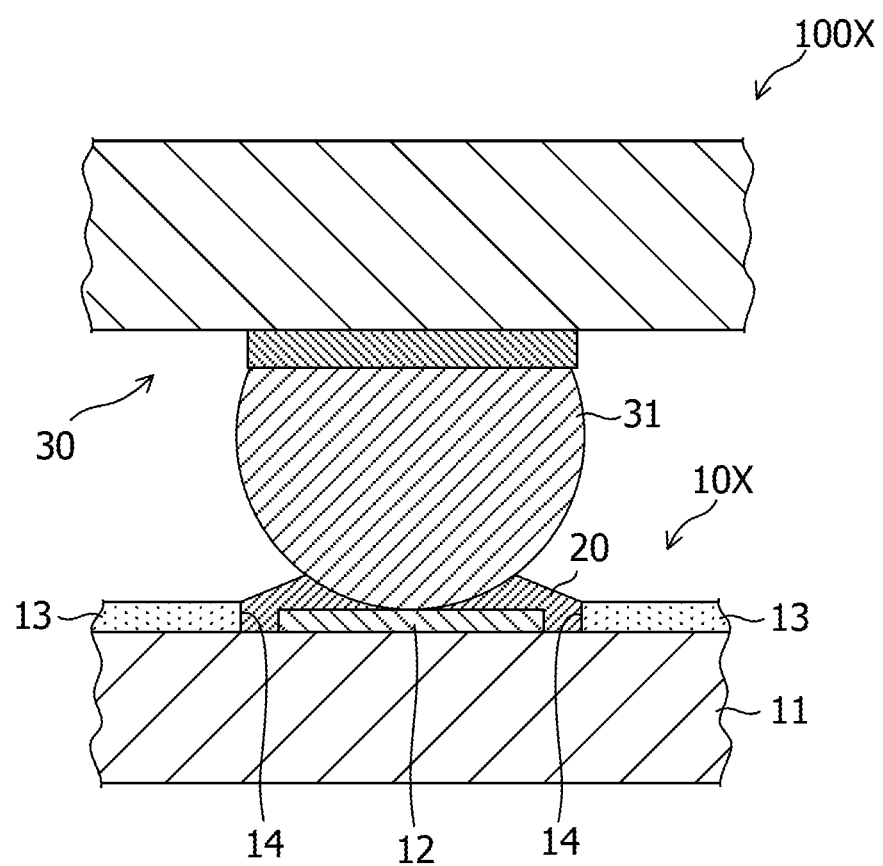
FIG. 6 is a cross-sectional view of an electronic apparatus according to a comparative example illustrating the structure around the junction between the wiring board and the electronic component.

FIG. 6 is a cross-sectional view of an electronic apparatus 100X according to a comparative example including a wiring board 10X according to a comparative example and the electronic component 30 illustrating the structure around the junction between the wiring board 10X and the electronic component 30. The solder resist 13 formed on the surface of the substrate 11 of the wiring board 10X of the comparative example is about 30 μm to 50 μm in thickness, which is thicker than the solder resist 13 of the wiring board 10 according to an embodiment of the disclosed technique. In other words, the wall surface 14 surrounding the outer circumference of the electrode 12 of the wiring board 10X of the comparative example is smaller in height than the wall surface 14 of the wiring board 10 according to the embodiment of the disclosed technique. The wiring board 10X according to the comparative example does not have the protrusion 15 of the wiring board 10 according to the embodiment of the disclosed technique. In the case of the wiring board 10X of the comparative example, the electrically conductive adhesive 20 that is pressed out of the electrode 12 by the pressure applied when the wiring board 10X and the electronic component 30 are joined is controlled so as to flow toward the ball-like terminal 31. Thus, it is difficult to make the electrically conductive adhesive 20 flow to a relatively higher position of the ball-like terminal 31.

Figure 7:
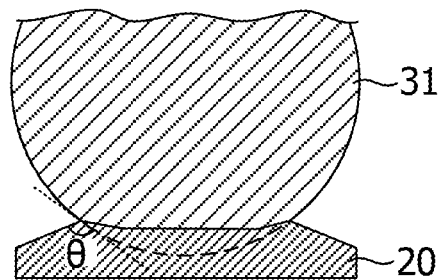
FIG. 7 is a diagram illustrating the state of contact between the electrically conductive adhesive and the ball-like terminal of the electronic apparatus of the comparative example.

FIG. 7 is a diagram illustrating the state of contact between the electrically conductive adhesive 20 and the ball-like terminal 31 of the electronic apparatus 100X of the comparative example. In the electronic apparatus 100X according to the comparative example, the fillet angle θ of the electrically conductive adhesive 20 is larger than 90°, so that only a small region of the end of the ball-like terminal 31 is covered with the electrically conductive adhesive 20. In other words, the shape of the fillet of the electrically conductive adhesive 20 of the electronic apparatus 100X according to the comparative example is undesirable.

In contrast, the wiring board 10 and the electronic apparatus 100 according to an embodiment of the disclosed technique provides a preferable fillet shape of the electrically conductive adhesive 20 such that the electrically conductive adhesive 20 reaches a relatively high position of the ball-like terminal 31, as illustrated in FIG. 5. This provides higher strength in the bonding between the ball-like terminal 31 and the electrode 12 than the bonding strength of the fillet shape illustrated in FIG. 7, thus increasing the reliability of bonding.

Since the wiring board 10 and the electronic apparatus 100 according to the present embodiment use the electrically conductive adhesive 20 in bonding the electronic component 30 and the wiring board 10 together, the bonding can be achieved by heat treatment at around 100° C. This reduces the occurrence of warping in the wiring board 10 and the electronic component 30 due to heating, thereby reducing the occurrence of a bonding defect between the ball-like terminal 31 and the electrode 12. Since the occurrence of warping in the wiring board 10 and the electronic component 30 is reduced, a decrease in reliability of bonding between the ball-like terminal 31 and the electrode 12 is reduced.

Furthermore, since the electronic component 30 and the wiring board 10 can be bonded together by heat treatment at about 100° C., a plurality of kinds of electronic components with different heat resistant temperatures can be mounted on the wiring board 10 by batch processing. The electrically conductive adhesive 20 does not change in condition by heating after being hardened. This allows applying the disclosed technique to an electronic component to be used in a high-temperature environment of 200° C. or more.

With the wiring board 10 and the electronic apparatus 100 according to the embodiment of the disclosed technique, the area of contact between the electrically conductive adhesive 20 and the ball-like terminal 31 can be large. This reduces the electrical resistance at the junction, thus saving the power of the electronic apparatus 100.

The protrusion 15 provided along the outer rim of the opening 16 of the solder resist 13 reduces overflowing of the electrically conductive adhesive 20 in the opening 16 to the outside of the opening 16. This reduces the risk of forming a bridge of the electrically conductive adhesive 20 between adjacent electrodes to cause a short circuit.

The use of resin ink for use in silk printing as the material of the protrusion 15 allows the protrusion 15 to be formed without an additional manufacturing process, thereby suppressing an increase in manufacturing cost due to addition of the protrusion 15.

Second Embodiment

Figure 8:
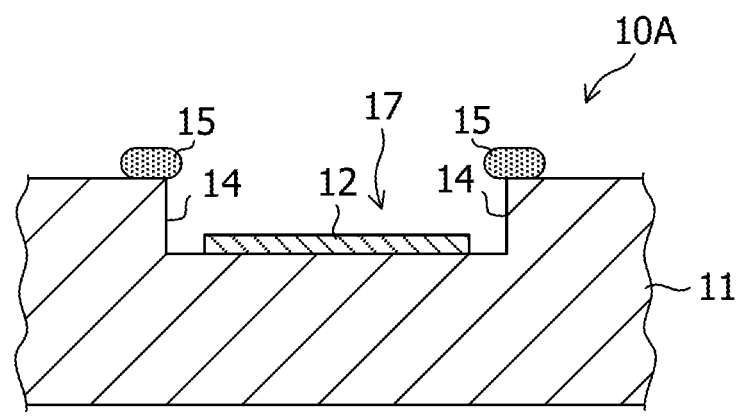
FIG. 8 is a cross-sectional view of a wiring board according to a second embodiment of the disclosed technique illustrating the configuration thereof.

FIG. 8 is a cross-sectional view of a wiring board 10A according to a second embodiment of the disclosed technique illustrating the configuration thereof. The wiring board 10A according to the present embodiment includes a substrate 11, an electrode 12, and a protrusion 15. In other words, the wiring board 10A according to the present embodiment includes no solder resist on the surface of the substrate 11.

A recess 17 is formed in the surface of the substrate 11. The electrode 12 is disposed on the bottom of the recess 17. In other words, the wiring board 10A according to the present embodiment differs from the wiring board 10 according to the first embodiment in that a wall surface 14 surrounding the outer circumference of the electrode 12 is formed of an end face of the recess 17 formed in the surface of the substrate 11. The electrode 12 may be a conductor of a wiring layer disposed in the substrate 11.

The protrusion 15 is disposed along the outer rim of the recess 17 on the surface of the substrate 11. The protrusion 15 is disposed at the upper end of the wall surface 14 and protrudes from the wall surface 14 inward of the ring shape defined by the wall surface 14.

Figure 9A:
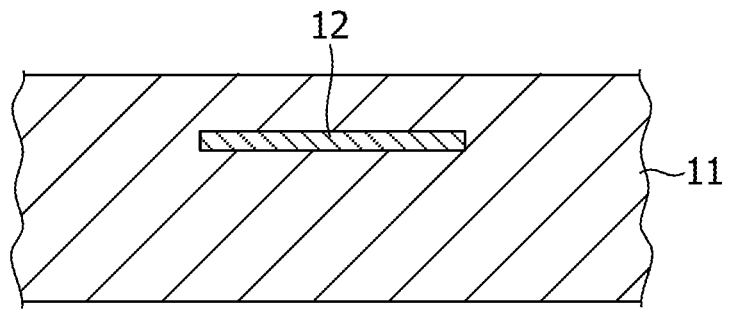
FIGS. 9A, 9B, and 9C are cross-sectional views of the wiring board according to the second embodiment of the disclosed technique illustrating an example of a method of manufacture.
Figure 9B:
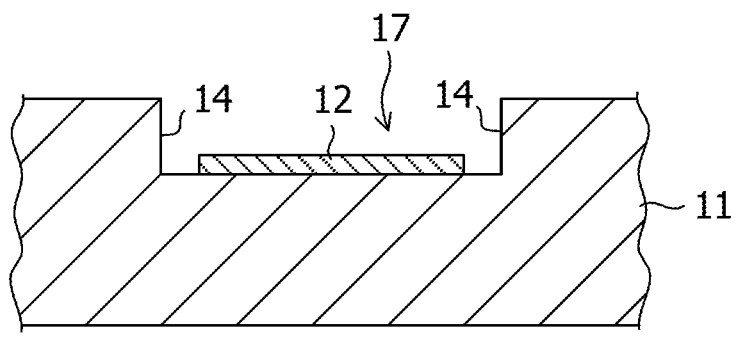
Figure 9C:
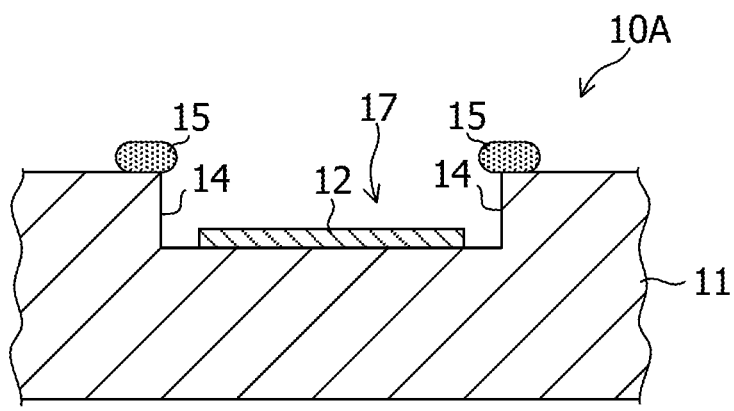

FIGS. 9A, 9B, and 9C are cross-sectional views of the wiring board 10A illustrating an example of a method of manufacture. First, the substrate 11 in which the electrode 12 is formed is prepared (FIG. 9A).

Next, the recess 17 is formed at a portion of the surface of the substrate 11 corresponding to the region in which the electrode 12 is formed by drilling or etching. This causes the electrode 12 to be exposed from the bottom of the recess 17. Exposing the electrode 12 from the bottom of the recess 17 forms the ring-shaped wall surface 14 surrounding the outer circumference of the electrode 12. The depth of the recess 17 (that is, the height of the wall surface 14) is preferably around 100 µm to 200 µm (FIG. 9B).

Next, resin ink or a resist material is applied to the surface of the substrate 11 along the outer rim of the recess 17 and is then hardened. Thus, the protrusion 15 is formed along the outer rim of the recess 17. The protrusion 15 is formed such that an end protrudes inward from the end face of the recess 17 (FIG. 9C).

Figure 10:
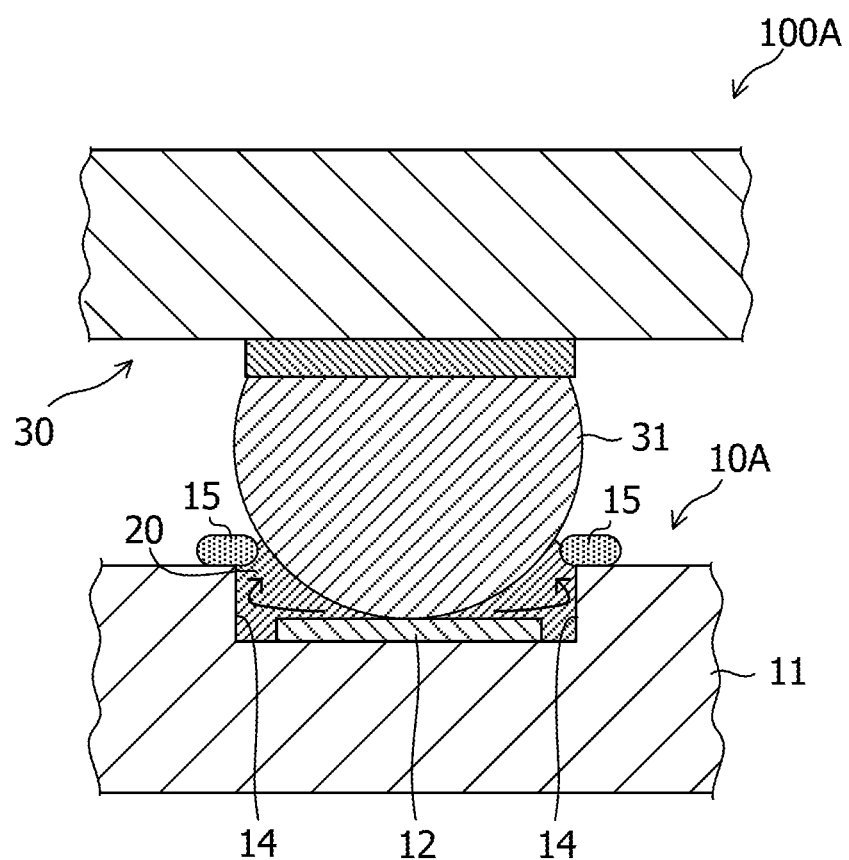
FIG. 10 is a cross-sectional view of an electronic apparatus according to the second embodiment of the disclosed technique illustrating the structure around the junction of the wiring board and the electronic component.

FIG. 10 is a cross-sectional view of an electronic apparatus 100A including the wiring board 10A and the electronic component 30 mounted on the wiring board 10A according to the second embodiment of the disclosed technique illustrating the structure around the junction of the wiring board 10A and the electronic component 30. The wiring board 10A and the electronic component 30 are bonded together with the electrically conductive adhesive 20 as in the case of the electronic apparatus 100 according to the first embodiment.

When a pressure that presses the ball-like terminal 31 to the electrically conductive adhesive 20 is applied to the electronic component 30, the electrically conductive adhesive 20 is pressed out of the electrode 12. The pressed-out electrically conductive adhesive 20 creeps upward along the wall surface 14 of the substrate 11. Thereafter, when the electrically conductive adhesive 20 reaches the protrusion 15, the direction in which the electrically conductive adhesive 20 flows changes toward the ball-like terminal 31. Thus, controlling the direction in which the electrically conductive adhesive 20 flows using the wall surface 14 and the protrusion 15 allows the electrically conductive adhesive 20 to reach a relatively high position of the ball-like terminal 31. Thereafter, the electrically conductive adhesive 20 is hardened by heat treatment, so that the bonding of the ball-like terminal 31 of the electronic component 30 and the electrode 12 of the wiring board 10A is completed.

With the wiring board 10A and the electronic apparatus 100A according to the present embodiment, the electrically conductive adhesive 20 can be guided toward the ball-like terminal 31 by the wall surface 14 and the protrusion 15 of the wiring board 10A. This provides a preferable fillet shape of the electrically conductive adhesive 20 such that the electrically conductive adhesive 20 reaches a relatively high position of the ball-like terminal 31. This provides higher bonding strength and reliability in the bonding between the ball-like terminal 31 and the electrode 12 than the bonding strength and reliability of the fillet shape illustrated in FIG. 7.

The wiring board 10A according to the present embodiment includes no solder resist. However, the ball-like terminal 31 is not welded when the ball-like terminal 31 and the electrode 12 are bonded, and the electrically conductive adhesive 20 does not have a cohesive property like molten solder. For this reason, there is no problem even if solder resist is not disposed.

Third Embodiment

Figure 11:
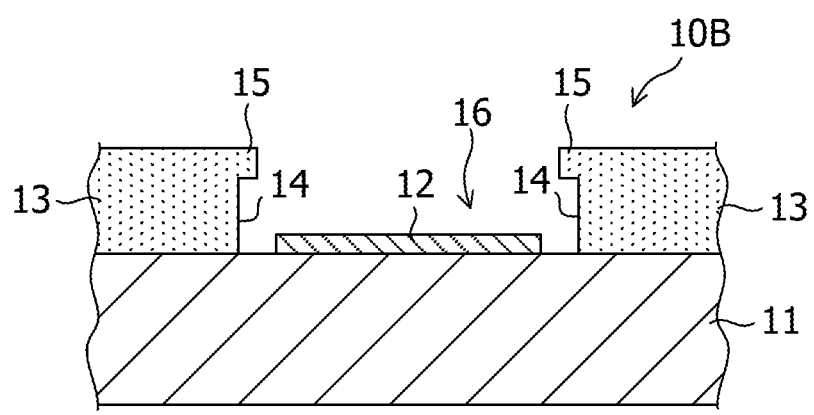
FIG. 11 is a cross-sectional view of a wiring board according to a third embodiment of the disclosed technique illustrating the configuration thereof.

FIG. 11 is a cross-sectional view of a wiring board 10B according to a third embodiment of the disclosed technique illustrating the configuration thereof. The wiring board 10B according to the present embodiment includes a substrate 11, an electrode 12, a solder resist 13, and a protrusion 15. The wiring board 10B according to the present embodiment differs from the wiring board 10 according to the first embodiment in that the protrusion 15 is formed of the uppermost layer of the solder resist 13.

The protrusion 15 is disposed along the outer rim of an opening 16 through which the electrode 12 is to be exposed. The protrusion 15 is disposed at the upper end of the wall surface 14 of the solder resist 13 and protrudes from the wall surface 14 inwards with respect to the ring shape defined by the wall surface 14.

Figure 12A:
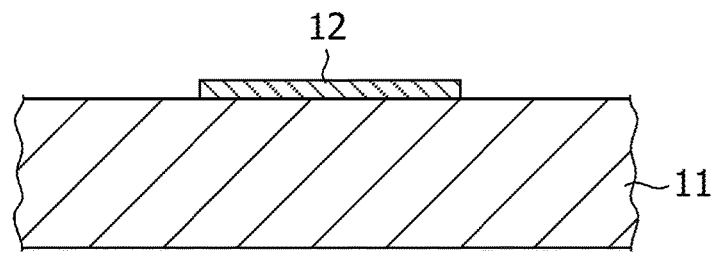
FIGS. 12A, 12B, and 12C are cross-sectional views of the wiring board according to the third embodiment of the disclosed technique illustrating a method of manufacture.
Figure 12B:
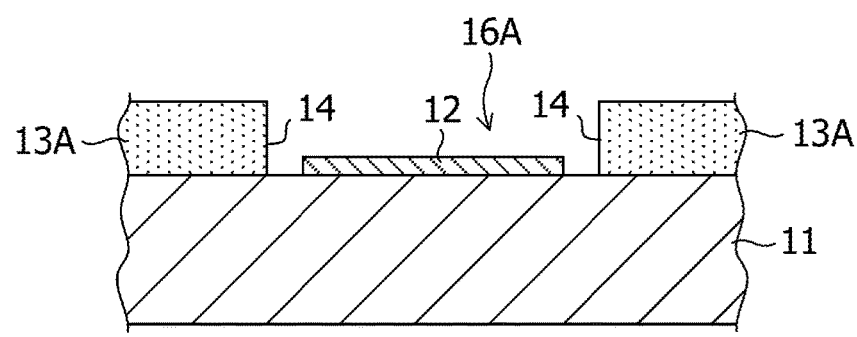
Figure 12C:
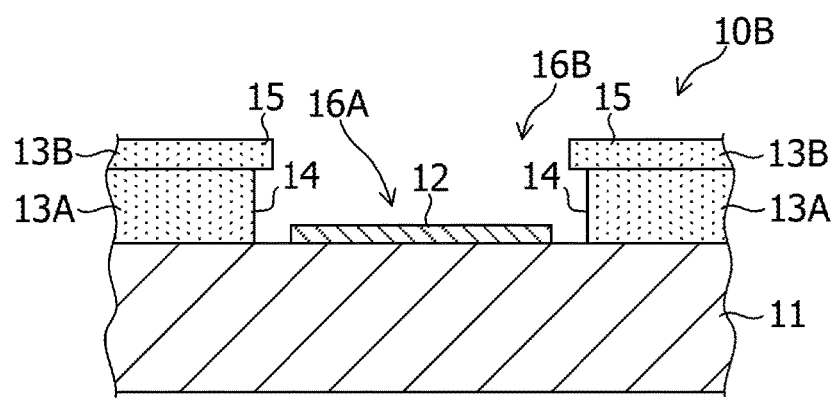

FIGS. 12A, 12B, and 12C are cross-sectional views of the wiring board 10B illustrating a method of manufacture. First, the electrode 12 is formed by patterning a conductor film formed on the surface of the substrate 11 (FIG. 12A).

Next, a solder resist 13A is formed on the entire surface of the substrate 11 by printing, spraying, or another method. Thereafter, the solder resist 13A is patterned by exposing and developing processes to form an opening 16A through the electrode 12 is to be exposed. Thus, the ring-shaped wall surface 14 surrounding the outer circumference of the electrode 12 is formed (FIG. 12B). After the opening 16A is formed, the solder resist 13A is hardened by heat treatment. The thickness of the solder resist 13A (that is, the height of the wall surface 14) is preferably about 100 µm to 200 µm.

Next, a dry-film type solder resist 13B is bonded to the surface of the solder resist 13A in which the opening 16A is formed. Thereafter, an opening 16B with a diameter smaller than the diameter of the opening 16A is formed in the solder resist 13B by exposing and developing processes. Thus, the protrusion 15 is formed along the outer rim of the opening 16A (FIG. 12C). After the opening 16B is formed, the solder resist 13B is hardened by heat treatment.

Figure 13:
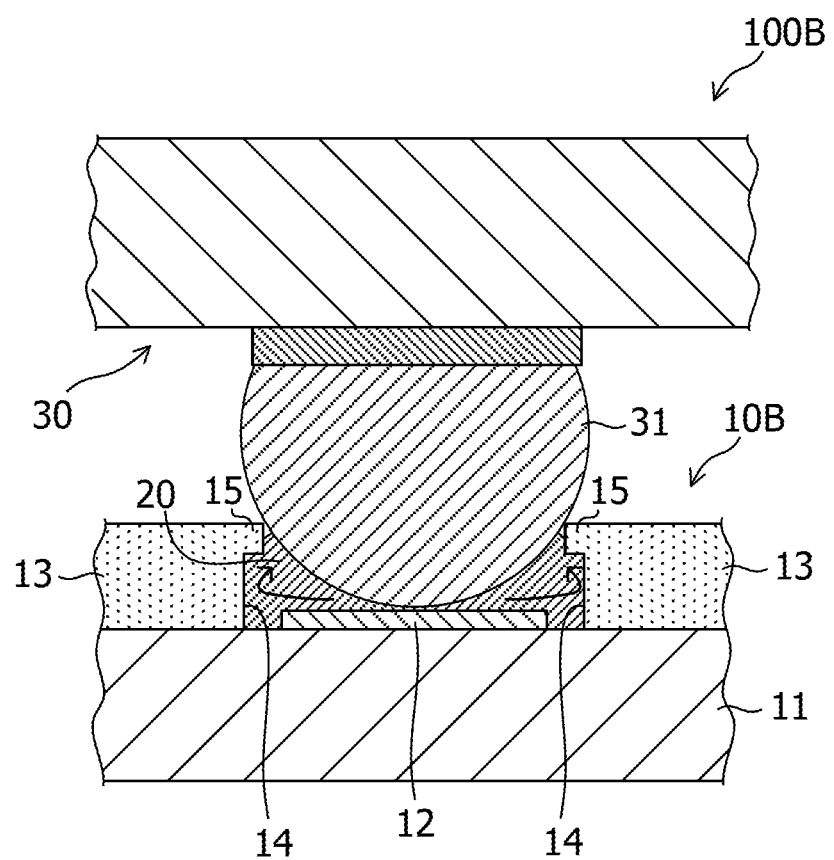
FIG. 13 is a cross-sectional view of an electronic apparatus according to the third embodiment of the disclosed technique illustrating the structure around the junction of the wiring board and the electronic component.

FIG. 13 is a cross-sectional view of an electronic apparatus 100B including the wiring board 10A and the electronic component 30 mounted on the wiring board 10A according to the third embodiment of the disclosed technique illustrating the structure around the junction of the wiring board 10B and the electronic component 30. The wiring board 10B and the electronic component 30 are bonded together with the electrically conductive adhesive 20 as in the case of the electronic apparatus 100 according to the first embodiment.

When a pressure that presses the ball-like terminal 31 to the electrically conductive adhesive 20 is applied to the electronic component 30, the electrically conductive adhesive 20 is pressed out of the electrode 12. The pressed-out electrically conductive adhesive 20 creeps upward along the wall surface 14 of the solder resist 13. Thereafter, when the electrically conductive adhesive 20 reaches the protrusion 15, the direction in which the electrically conductive adhesive 20 flows changes toward the ball-like terminal 31. Thus, controlling the direction in which the electrically conductive adhesive 20 flows using the wall surface 14 and the protrusion 15 allows the electrically conductive adhesive 20 to reach a relatively high position of the ball-like terminal 31. Thereafter, the electrically conductive adhesive 20 is hardened by heat treatment, so that the bonding of the ball-like terminal 31 of the electronic component 30 and the electrode 12 of the wiring board 10B is completed.

With the wiring board 10B and the electronic apparatus 100B according to the present embodiment, the electrically conductive adhesive 20 can be guided toward the ball-like terminal 31 by the wall surface 14 and the protrusion 15 of the wiring board 10B. This provides a preferable fillet shape of the electrically conductive adhesive 20 such that the electrically conductive adhesive 20 reaches a relatively high position of the ball-like terminal 31. This provides higher bonding strength and reliability in the bonding between the ball-like terminal 31 and the electrode 12 than the bonding strength and reliability of the fillet shape illustrated in FIG. 7.

Fourth Embodiment

Figure 14:
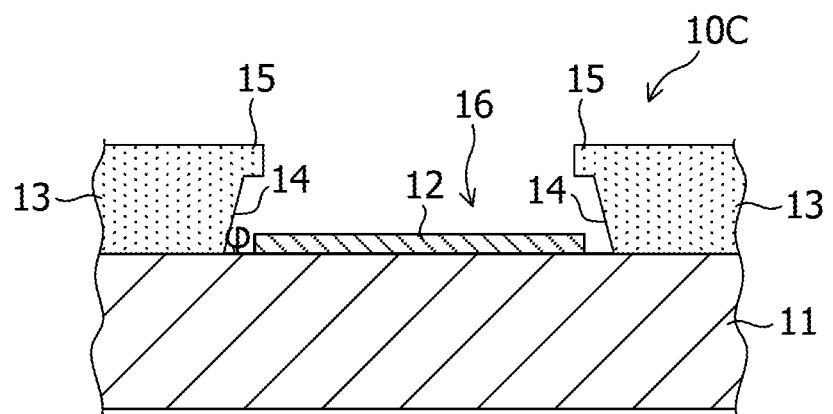
FIG. 14 is a cross-sectional view of a wiring board according to a fourth embodiment of the disclosed technique illustrating the configuration thereof.

FIG. 14 is a cross-sectional view of a wiring board 10C according to a fourth embodiment of the disclosed technique illustrating the configuration thereof. The wiring board 10C according to the present embodiment includes a substrate 11, an electrode 12, a solder resist 13, and a protrusion 15. The wiring board 10C according to the present embodiment differs from the wiring board 10B according to the third embodiment in that an opening 16 formed in the solder resist 13 has a tapered shape in cross section.

Specifically, the diameter of the opening 16 of the solder resist 13 gradually decreases upward. In other words, the upper end of the ring-shaped wall surface 14 around the outer circumference of the electrode 12 inclines inward of the ring shape defined by the wall surface 14. The cone angle φ of the tapered opening 16 is preferably larger than or equal to 60° and less than 90°. Setting the cone angle φ to 60° or larger reduces the distance between the electrode 12 and the solder resist 13, thereby reducing the distance between electrodes. This facilitates using the disclosed technique in manufacturing fine-pitch components.

The protrusion 15 is disposed along the outer rim of the opening 16 through which the electrode 12 is to be exposed. The protrusion 15 is disposed along the upper end of the wall surface 14 of the solder resist 13 and protrudes from the wall surface 14 inward of the ring shape defined by the wall surface 14.

Figure 15A:
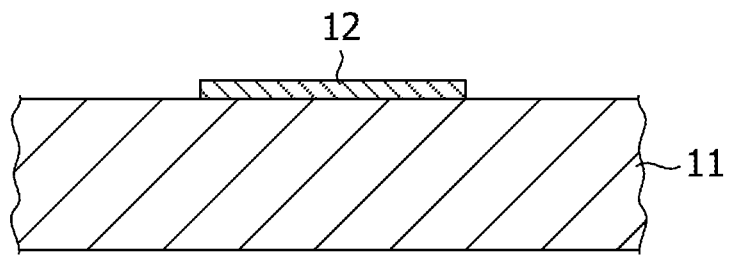
FIGS. 15A, 15B, 15C, 15D, and 15E are cross-sectional views of the wiring board according to the fourth embodiment of the disclosed technique illustrating an example of a method of manufacture.

FIGS. 15A, 15B, 15C, 15D, and 15E are cross-sectional views of the wiring board 10C illustrating an example of a method of manufacture. First, the electrode 12 is formed by patterning a conductor film on the surface of the substrate 11 (FIG. 15A).

Figure 15B:
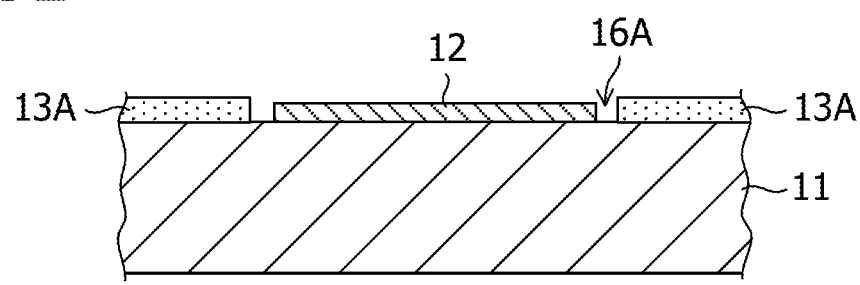

Next, a dry-film type solder resist 13A is bonded to the surface of the substrate 11, and the solder resist 13A is patterned by exposing and developing processes to form an opening 16A through which the electrode 12 is to be exposed. Thereafter, the solder resist 13A is hardened by heat treatment (FIG. 15B).

Figure 15C:
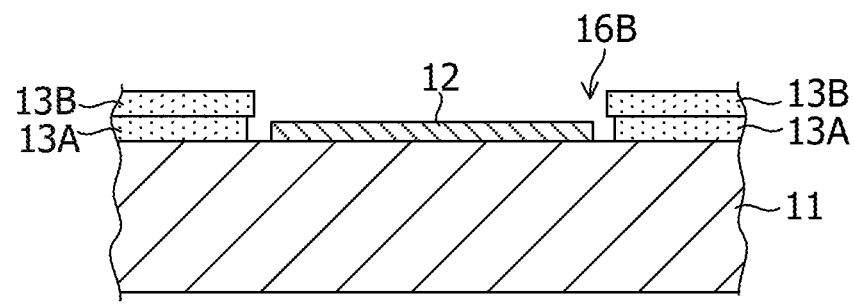

Next, a dry-film type solder resist 13B is bonded to the surface of the solder resist 13A. Thereafter, an opening 16B with a diameter smaller than the diameter of the opening 16A is formed in the solder resist 13B by exposing and developing processes. Thereafter, the solder resist 13B is hardened by heat treatment (FIG. 15C).

Figure 15D:
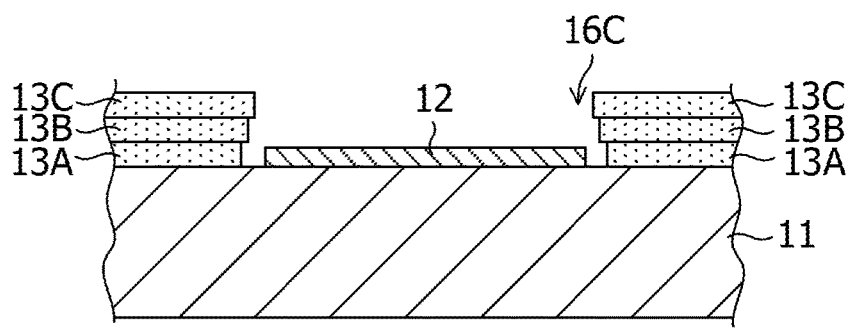

Next, a dry-film type solder resist 13C is bonded to the surface of the solder resist 13B. Thereafter, an opening 16C with a diameter smaller than the diameter of the opening 16B is formed in the solder resist 13C by exposing and developing processes. Thereafter, the solder resist 13C is hardened by heat treatment (FIG. 15D).

Figure 15E:
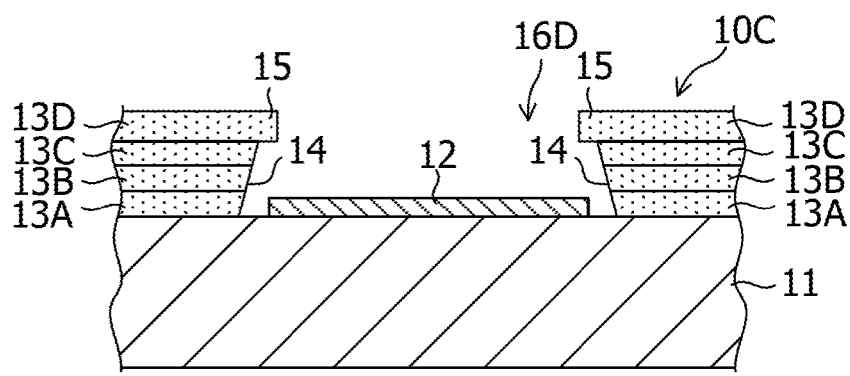

Next, a dry-film type solder resist 13D for forming the protrusion 15 is bonded to the surface of the solder resist 13C. Thereafter, an opening 16D with a diameter smaller than the diameter of the opening 16C is formed in the solder resist 13D by exposing and developing processes. Thereafter, the solder resist 13D is hardened by heat treatment (FIG. 15E).

Thus, the opening 16 having a tapered cross-sectional shape can be formed in the solder resist 13 by decreasing the diameters of the respective openings 16A, 16B, and 16C of the dry-film type solder resists 13A, 13B, and 13C in sequence. By making the diameter of the opening 16D formed in the uppermost dry-film type solder resist 13D smaller than the diameter of the opening 16C, the protrusion 15 protruding from the wall surface 14 inward of the opening 16 can be formed.

The number of layers of the dry-film type solder resist 13 can be appropriately changed according to the height of the wall surface 14 surrounding the electrode 12. In the above example, a plurality of dry-film type solder resists are layered to form the solder resist 13. The solder resist 13 may be formed on the entire surface of the substrate 11 by printing, spraying, or another method.

Figure 16:
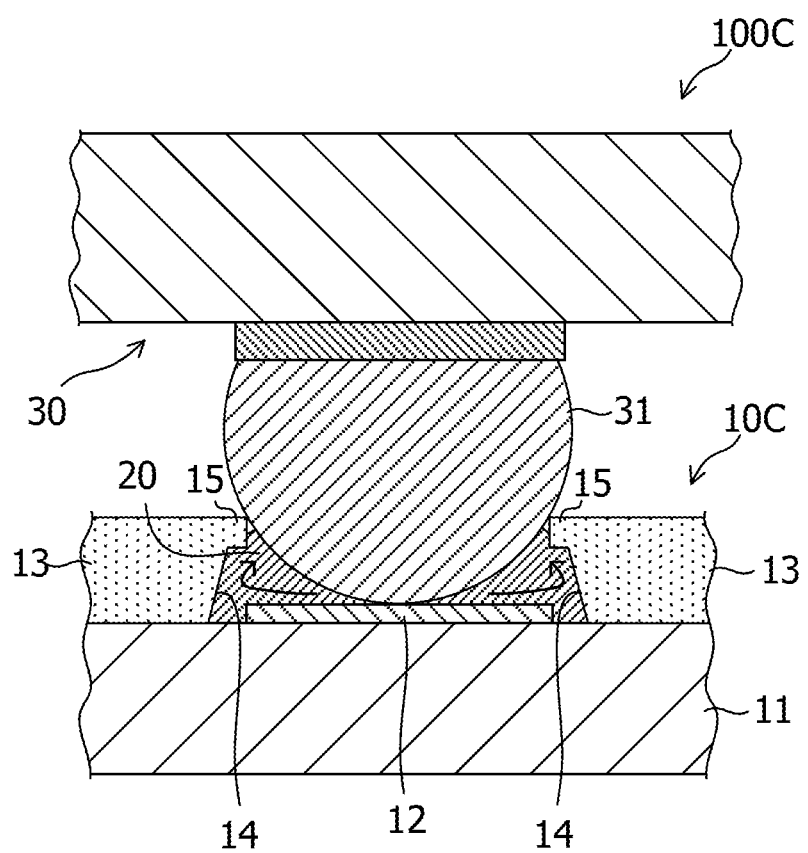
FIG. 16 is a cross-sectional view of an electronic apparatus according to the fourth embodiment of the disclosed technique illustrating the structure around the junction of the wiring board and the electronic component.

FIG. 16 is a cross-sectional view of an electronic apparatus 100C including the wiring board 10C and the electronic component 30 mounted on the wiring board 10C according to the fourth embodiment of the disclosed technique illustrating the structure around the junction of the wiring board 10C and the electronic component 30. The wiring board 10C and the electronic component 30 are bonded together with the electrically conductive adhesive 20 as in the case of the electronic apparatus 100 according to the first embodiment.

When a pressure that presses the ball-like terminal 31 to the electrically conductive adhesive 20 is applied to the electronic component 30, the electrically conductive adhesive 20 is pressed out of the electrode 12. The pressed-out electrically conductive adhesive 20 creeps upward along the wall surface 14 of the solder resist 13. Thereafter, when the electrically conductive adhesive 20 reaches the protrusion 15, the direction in which the electrically conductive adhesive 20 flows changes toward the ball-like terminal 31. Thus, controlling the direction in which the electrically conductive adhesive 20 flows using the wall surface 14 and the protrusion 15 allows the electrically conductive adhesive 20 to reach a relatively high position of the ball-like terminal 31. The tapered shape in cross section of the opening 16 of the solder resist 13 enhances the effect of guiding the electrically conductive adhesive 20 toward the ball-like terminal 30.

Thereafter, the electrically conductive adhesive 20 is hardened by heat treatment, so that the bonding of the ball-like terminal 31 of the electronic component 30 and the electrode 12 of the wiring board 10B is completed.

With the wiring board 10C and the electronic apparatus 100C according to the present embodiment, the electrically conductive adhesive 20 can be guided toward the ball-like terminal 31 by the wall surface 14 and the protrusion 15 of the wiring board 10C. This provides a preferable fillet shape of the electrically conductive adhesive 20 such that the electrically conductive adhesive 20 reaches a relatively high position of the ball-like terminal 31. This provides higher bonding strength and reliability in the bonding between the ball-like terminal 31 and the electrode 12 than the bonding strength and reliability of the fillet shape illustrated in FIG. 7.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
   a substrate;
   an electrode having a round shape formed over the substrate;
   a solder resist formed over the substrate and includes an opening configured to expose the electrode, an upper end of the solder resist is located at a position higher than a top surface of the electrode; and
   a ring-shaped resin layer formed on the solder resist and configured to cover a wall surface of the opening along the opening;
   the ring-shaped resin layer is configured to protrude from the wall surface inward of a ring shape defined by the wall surface,
   an inner diameter of the ring-shaped resin layer is larger than a diameter of the electrode, and
   an inward end of the ring-shaped resin layer is rounded due to sagging.

2. The wiring board according to claim 1,
   wherein the opening of the solder resist is configured to expose a top surface and a side surface of the electrode.

3. The wiring board according to claim 1,
   wherein the substrate has a recess including the electrode on a bottom of the recess, and
   wherein the wall surface is formed of an end face of the recess.

4. The wiring board according to claim 1, wherein the ring-shaped resin layer is made of resin ink.

5. The wiring board according to claim 1, wherein the ring-shaped resin layer is made of solder resist.

6. The wiring board according to claim 1, wherein the wall surface inclines such that an upper end protrudes inward of the ring shape.

7. An electronic apparatus comprising:
   a wiring board including a substrate and an electrode on a surface of the substrate; and
   an electronic component including a ball-like terminal,
   the electrode and the ball-like terminal are bonded together with an electrically conductive adhesive, and
   the wiring board includes
   a solder resist formed over the substrate and includes an opening configured to expose the electrode, an upper end of the solder resist is located at a position higher than a top surface of the electrode; and
   a ring-shaped resin layer formed on the solder resist and configured to cover a wall surface of the opening along the opening;
   the ring-shaped resin layer is configured to protrude from the wall surface inward of a ring shape defined by the wall surface,
   an inner diameter of the ring-shaped resin layer is larger than a diameter of the electrode, and
   an inward end of the ring-shaped resin layer is rounded due to sagging.

8. The electronic apparatus according to claim 7, wherein a space defined by the electrode, the wall surface, the protrusion, and a lower surface of the ball-like terminal is filled with the electrically conductive adhesive.

9. The electronic apparatus according to claim 7,
   wherein the opening of the solder resist is configured to expose a top surface and a side surface of the electrode.

10. The electronic apparatus according to claim 7,
    wherein the substrate has a recess including the electrode on a bottom of the recess, and
    wherein the wall surface is formed of an end face of the recess.

11. The electronic apparatus according to claim 7, wherein the ring-shaped resin layer is made of resin ink.

12. The electronic apparatus according to claim 7, wherein the ring-shaped resin layer is made of solder resist.

13. The electronic apparatus according to claim 7, wherein the wall surface inclines such that an upper end protrudes inward of the ring shape.

14. The wiring board according to claim 1, wherein an outward end of the ring-shaped resin layer is rounded due to sagging.

15. The wiring board according to claim 1, wherein the solder resist is a resist formed by layering a plurality of dry-film type solder resists.

* * * * *